United States Patent [19]

Tsutsumi et al.

[11] Patent Number: 5,206,340
[45] Date of Patent: Apr. 27, 1993

[54] INTEGRATED CIRCUIT SOCKET COMPRISING A POLYIMIDE POLYMER

[75] Inventors: Toshihiko Tsutsumi; Toshiyuki Nakakura, both of Yokohama; Taizo Nagahiro, Tokyo; Shuithi Morikawa, Kanagawa; Nobuhito Koga, Yokohama, all of Japan

[73] Assignee: Mitsui Toatsu Chemicals, Inc., Tokyo, Japan

[21] Appl. No.: 452,369

[22] Filed: Dec. 19, 1989

[30] Foreign Application Priority Data

Dec. 27, 1988 [JP] Japan .................. 63-327636

[51] Int. Cl.$^5$ .................. C08G 69/26; C08G 8/02; C08G 75/00; C08J 67/02
[52] U.S. Cl. .................. 528/353; 524/606; 524/608; 528/125; 528/128; 528/171; 528/172; 528/173; 528/183; 528/185; 528/188; 439/55
[58] Field of Search .............. 528/125, 128, 183, 185, 528/188, 171, 172, 173, 353; 524/606, 608

[56] References Cited

U.S. PATENT DOCUMENTS

| | | | |
|---|---|---|---|
| 4,410,231 | 10/1983 | Senor | 339/218 |
| 4,722,060 | 1/1988 | Quinn et al. | 364/490 |
| 4,795,798 | 1/1989 | Tamai et al. | 528/125 |
| 4,838,799 | 6/1989 | Tonooka | 439/70 |
| 4,847,349 | 7/1989 | Ohta et al. | 528/125 |

FOREIGN PATENT DOCUMENTS 0090059 3/1982 European Pat. Off. .
63-32881 2/1988 Japan .

OTHER PUBLICATIONS

Chemical Abstracts, vol. 77, No. 12, 18 Sep. 1972, p. 51, Abstract No. 7617x, "Materials for High Temperature Integrated Circuit Testing", pp. 86–92.

*Primary Examiner*—John Kight, III
*Assistant Examiner*—T. Mosley
*Attorney, Agent, or Firm*—Burns, Doane, Swecker & Mathis

[57] ABSTRACT

Integrated circuit sockets for use in a burn-in test are disclosed. The IC sockets are produced by injection molding of a specific polyimide having an inherent viscosity of 0.35 to 0.65 dl/g and essentially consisting of recurring units represented by the formula (I):

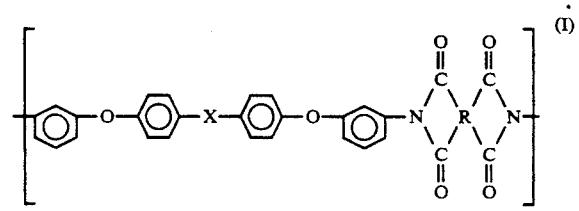

wherein X is a radical selected from the group consisting of a bond, divalent hydrocarbon having from 1 to 10 carbon atoms, etc. and R is a tetravalent radical selected from the group consisting of an aliphatic radical having two or more carbon atoms, cycloaliphatic radical, monoaromatic radical etc.

9 Claims, No Drawings

INTEGRATED CIRCUIT SOCKET COMPRISING A POLYIMIDE POLYMER

BACKGROUND OF THE INVENTION a) Field of the Invention

The present invention relates to a socket prepared from a specific polyimide and used for an integrated circuit (hereinafter abbreviated as IC), and particularly relates to the IC socket for use in a burn-in test.

b) Description of the Prior Art

An IC is generally subjected to a performance test at elevated temperatures, i.e., so-called burn-in test, prior to mounting the IC on equipment in order to confirm its reliability in performance.

In the burn-in test, the electric current is passed through the IC under almost operating conditions by maintaining elevated temperatures of usually 70° to 170° C. and deterioration in the operating state or the presence of an unstable state are checked. The IC accepted by the test guarantees sufficient reliability in various equipment.

An IC socket which is a connection member used to fix an IC on a printed board is exposed to the above elevated temperatures in the state of holding the IC therein. Consequently, thermal resistance is of course required for the insulation materials used for the socket.

However, the burn-in performance test of the IC has recently been carried out at further elevated temperatures in order to accelerate evaluation and improve reliability. As a result, IC sockets made by conventional resins cannot withstand such high temperatures at all in some cases.

For example, glass fiber reinforced resins such as polyethylene terephthalate resin, polybutylene terephthalate resin, and nylon resin can be used up to temperatures of approximately 120° C. At higher temperatures, however, these resins lead to remarkable deterioration of characteristics such as dimensional stability and creep property, and cannot be applied to practical use. Hence, resins having better thermal resistance such as polyphenylene sulfide resin, polysulfone resin, and polyether sulfone resin have been used. Any of these resins, however, practically has a maximum use temperature of 170° C.

In addition to thermal resistance, excellent characteristics are required in many cases for resistance to cleaning chemicals such as isopropyl alcohol, ethyl alcohol, toluene, benzene, trichloroethylene, 1,1,1-trichloroethane, fluorinated methane (e.g. FREON: Trade Mark of a product of E.I. du Pont), acetone, and methanol; steam resistance; and flame retardance. It has hence been difficult to meet these characteristics using conventional resins.

Further, polyimide has been well known as a resin having excellent characteristics such as thermal resistance and chemical resistance. However, conventional polyimide does not melt flow as the polyimide and thus it has been impossible to produce molded articles by common processing methods, for example, injection molding. Although included in the technology of polyimide, a polyetherimide (e.g. ULTEM 1000: TM of a product of General Electric Co.) prepared from tetracarboxyalic acid dianhydride containing an ether linkage in the molecule exceptionally exhibits melt flow at high temperatures. Molded articles can hence be prepared from the polyetherimide by compression molding or injection molding.

However, even though the molded polyetherimide is used as the IC socket, thermal resistance and chemical resistance have still been unsatisfactory.

SUMMARY OF THE INVENTION

The object of the present invention is to provide an IC socket having excellent characteristics such as thermal resistance, chemical resistance, steam resistance, and flame retardance by using a specific polyimide as a raw material obtained by reaction of an etherdiamine with a tetracarboxylic acid dianhydride.

That is, one aspect of the invention is an IC socket comprising a polyimide consisting essentially of recurring units represented by the formula (I):

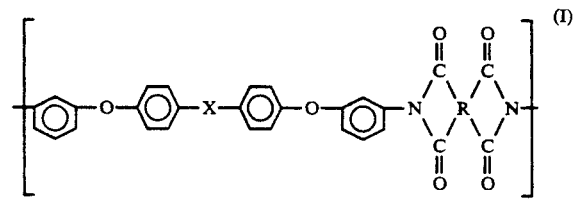

wherein X is a radical selected from the group consisting of a bond, divalent hydrocarbon having from 1 to 10 carbon atoms, hexafluorinated isopropylidene, carbonyl, thio, or sulfonyl, and R is a tetravalent radical selected from the group consisting of an aliphatic radical having two or more carbon atoms, cycloaliphatic radical, monoaromatic radical, condensed polyaromatic radical, and non-condensed polyaromatic radical wherein aromatic radicals are mutually connected with a bond or a crosslinking function.

DETAILED DESCRIPTION OF THE INVENTION

The above polyimide is obtained by reacting an etherdiamine represented by the formula (II):

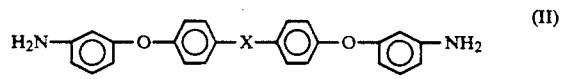

wherein X is the same as above,
with one or more of tetracarboxylic acid dianhydride represented by the formula (III):

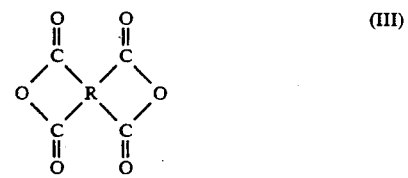

wherein R is the same as above.

The polyimide of this invention is characterized in that a diamine having ether linkages in the molecule is used for a raw material and can be readily prepared by processes such as disclosed in U.S. Pat. No. 4,847,349. Any polyimide disclosed in this patent can be used in the present invention.

Particularly preferred polyimides can be prepared by using the following raw materials. Preferred etherdiamines are 4,4'-bis[4-(3-aminophenoxy)phenyl] sulfide, 4,4'-bis[4-(3-aminophenoxy)phenyl] sulfone, 4,4'-bis(3-aminophenoxy)benzophenone, 4,4'-bis(3-aminophenoxy)biphenyl, 2,2-bis[4-(3-aminophenoxy)phenyl]propane and 2,2-bis[4-(3-aminophenoxy)phenyl]-1,1,1,3,3,3-hexafluoropropane. The diamine can be used alone or in mixtures of two or more. Preferred tetracarboxylic acid dianhydrides are pyromellitic dianhydride, 3,3',4,4'-biphenyltetracarboxylic dianhydride, 3,3',4,4'-benzophenonetetracarboxylic dianhydride, 3,3',4,4'-diphenylethertetracarboxylic dianhydride and p-phenyleneoxydi(4-phthalic) dianhydride. The dianhydride can be used alone or in mixtures of two or more.

The polyimide obtained by the above process and used for the present invention has an inherent viscosity of usually from 0.35 to 0.65 dl/g and preferably from 0.40 to 0.60 dl/g. An inherent viscosity less than 0.35 leads to insufficient mechanical strengths and durability. When the inherent viscosity exceeds 0.65, processability is impaired and injection molding becomes difficult.

The inherent viscosity is measured at 35° C. with a solution containing 0.5 g of the sample in 100 ml of a solvent mixture composed of p chlorophenol/phenol in a ratio of 90/10 by weight.

The IC socket can be produced from the above polyimide. Glass fiber can be added to the polyimide in order to enhance thermal resistance and mechanical strengths.

Various grades of glass fiber are available in the market depending upon alkali content ($Na_2O$), fiber length and diameter. Any grade can be used and no particular restriction is imposed upon the glass fiber. The amount of glass fiber used is usually 40% by weight or less and preferably 30% by weight or less per weight of the composition containing the polyimide and glass fiber. When the amount of glass fiber exceeds 40% by weight, melt flowability of the composition decreases, injection molding becomes difficult and surface appearance of the molded articles becomes poor.

In addition to glass fiber, colorants, various fillers other than glass fiber, extenders, stabilizers and lubricants can be incorporated into the polyimide.

The IC socket of this invention can be produced by injection molding using the polyimide as the raw material in the form of powder or pellets. In the cases where the polyimide is used in combination with glass fiber or various other additives, the polyimide is previously fused and kneaded by utilizing usual blending equipment such as hot rolls, Banbury mixer, Henschel mixer, Brabender tumbler and an extruder. The resulting powder or pellets can be molded by injection process.

The injection molding conditions for the production of various types of the IC socket are generally a cylinder temperature of 30° to 450° C., a mold temperature of 150° to 230° C. and the injection pressure of 50 to 1500 kg/cm². Exemplary types of the IC socket which can be produced include, for example, Quard Flat Package (QFP) typically having a pin number of 40 to 100 and a pitch of 0.5 mm, Leadless Chip Carrier (LCC) typically having a pin number of 18 to 84 and a pitch of 1.27 mm, Dual In Line Package (DIP), Single In Line Package (SIP), Small Out Line Package (SOP), Chip Carrier (CC) and Pin Grid Array Substrate (PGA).

The IC socket of this invention is produced by using a novel polyimide resin which is excellent in thermal resistance, chemical resistance, steam resistance and flame retardance. Hence the IC socket exhibits outstanding characteristics and can be used for a broad range of connection members.

EXAMPLES

The present invention will hereinafter be illustrated by way of examples, which are intended to be purely exemplary of the invention.

EXAMPLE 1

Polyimide powder was used which was prepared from 4,4-bis(3-aminophenoxy)biphenyl as a diamine of the formula (II) and pyromellitic dianhydride as a dianhydride of the formula (III) and had an inherent viscosity of 0.45 dl/g. The inherent viscosity was measured at 35° C. with a solution containing 0.5 g of the polyimide in 100 ml of a solvent mixture composed of p-chlorophenol/phenol in a ratio of 90/10 by weight.

The polyimide powder was extruded by an extruder at a cylinder temperature of 400° C. and cut into pellets. The pellets were injection molded under conditions of a cylinder temperature of 380° to 410° C., mold temperature of 190° C., and an injection pressure of 700 kg/cm².

A QFP type IC socket having a pin number of 64 and a pitch of 0.5 mm was obtained. The socket was brown colored and transparent and had an excellent appearance without silver blisters, sink marks or flow marks.

The IC socket was tested under the following conditions.

(1) Appearance after immersion in toluene and trichloroethylene for 10 days.

(2) Appearance after exposure to heated steam of 2 kg/cm² for 200 hours.

(3) Appearance after exposure in a hot air oven at 230° C. for 100 hours.

In each test, no change was observed in the appearance.

Specimens specified in ASTM were prepared by injection molding of the pellets under the same conditions as above and properties of the specimens were tested. Heat distortion temperature at 240° C. in accordance with ASTM, D-648. Flexural strength was 1400 kg/cm² in accordance with ASTM, D-790. Critical oxygen index was 47 at 3.2 mm in thickness in accordance with ASTM, D-2863.

Consequently, the polyimide was proved to have good properties as a material for an IC socket.

COMPARATIVE EXAMPLE 1

Polyetherimide pellets (ULTEM 1000: TM of a product of General Electric Co.) were used in place of the polyimide powder in Example 1. The ULTEM pellets were injection molded at a cylinder temperature of 330° to 400° C., mold temperature of 150° C. and the injection pressure of 800 kg/cm². The same QFP type IC socket as molded in Example 1 was obtained.

The IC socket thus obtained showed remarkable whitening over the whole surface after immersion in trichloroethylene for 10 days. Many cracks also occurred on the IC socket after exposure to heated steam at 2 kg/cm² for 200 hours. Further the socket was severely deformed beyond recognition after exposure in the hot air oven at 230° C. for 100 hours.

EXAMPLE 2

To a tumbler, 70 parts by weight of the polyimide powder used in Example 1 and 30 parts by weight of a glass fiber having a length of 3 mm and an aspect ratio of 250 were charged and thoroughly mixed. The mixture obtained was then pelletized.

The resulting pellets were injection molded as in Example 1 at a cylinder temperature of 390° to 420° C., mold temperature of 200° C. and an injection pressure of 1000 kg/cm². The same type of IC socket as molded in Example 1 was obtained. The socket had an excellent appearance without silver blisters, sink marks or flow marks.

As examined in Example 1, the appearance of the IC socket thus obtained was checked after immersion in toluene and trichloroethylene for 10 days, after exposure to heated steam at 2 kg/cm² for 200 hours, and after exposure in a hot air oven at 230° C. for 100 hours. In each of the above tests, no change was observed on the appearance of the socket.

Specimens specified in ASTM were prepared by injection molding of the pellets under the same conditions as above and properties of the specimens were tested. Heat distortion temperature was 243° C., and flexural strength was 2400 kg/cm².

COMPARATIVE EXAMPLE 2

Polyetherimide pellets containing 30% of glass fiber (ULTEM 2300: TM of a product of General Electric Co.) were used in place of the polyimide pellets of Example 2 which contain glass fiber.

The ULTEM pellets were injection molded at a cylinder temperature of 340° to 410° C., mold temperature of 150° C., and injection pressure of 1100 kg/cm . The same QFP type IC socket as molded in Example 2 was obtained.

After immersion in trichloroethylene for 10 days, the IC socket thus obtained showed remarkable whitening over the whole surface and raised glass fiber was observed. The socket also showed whitening over the whole surface after exposure to heated steam of 2 kg/cm² for 200 hours. After exposure in a hot air oven at 230° C. for 100 hours, the IC socket was deformed and irregularities of the pitch were remarkably found.

EXAMPLE 3

The pellets obtained in Example 2 were injection molded at a cylinder temperature of 390° to 420° C., mold temperature of 200° C. and an injection pressure of 900 kg/cm².

A LCC type IC socket having a pin number of 84 and a pitch of 1.27 mm was obtained. The socket had an excellent appearance without silver blisters, sink marks or flow marks.

As examined in Example 1, the appearance of the IC socket thus obtained was checked after immersion in toluene and trichloroethylene for 10 days, after exposure to heated steam at 2 kg/cm² for 200 hours, and after exposure in a hot air oven at 230° C. for 100 hours. In each of the above tests no change was observed on the appearance of the socket.

COMPARATIVE EXAMPLE 3

The pellets of ULTEM 2300 (TM) used in Comparative Example 2 were injection molded at a cylinder temperature of 340° to 410° C., mold temperature of 150° C. and injection pressure of 1000 kg/cm². The same LCC type IC socket as molded in Example 3 was obtained.

After immersion in trichloroethylene for 10 days, the IC socket thus obtained showed remarkable whitening over the whole surface and raised glass fiber was observed. The socket also showed whitening over the whole surface after exposure to heated steam at 2 kg/cm² for 200 hours. After exposure in a hot air oven at 230° C. for 100 hours, the IC socket was deformed and irregularities of the pitch were remarkably found.

EXAMPLE 4

Polyimide powder was used which was prepared from bis[4-(3-aminophenoxy)phenyl]sulfide as a diamine of the formula (II) and pyromellitic dianhdyride as a dianhydride of the formula (III) and had an inherent viscosity of 0.46 dl/g. The polyimide powder was pelletized by the same procedures as carried out in Example 1. The pellets obtained were injection molded under the same conditions as in Example 1. A QFP type IC socket having a pin number of 64 and a pitch of 0.5 mm was obtained. The socket thus obtained had excellent characteristics which are comparable to those of Example 1.

Specimens were molded by the same procedures as carried out in Example 1 and physical properties of the specimens were measured. Heat distortion temperature was 238° C. Flexural strength was 1350 kg/cm².

EXAMPLE 5

To a tumbler, 70 parts by weight of the polyimide powder used in Example 4 and 30 parts by weight of a glass fiber having a length of 3 mm and an aspect ratio of 250 were charged and thoroughly mixed. The mixture obtained was then pelletized. The resulting pellets were injection molded by the same procedures as carried out in Example 2. The resulting QFP type IC socket having a pin number of 64 and a pitch of 0.5 mm was excellent in appearance similar to that of Example 2.

As examined in Example 2, the appearance of the IC socket thus obtained was checked after immersion in toluene and trichloroethylene for 10 days, after exposure to heated steam at 2 kg/cm² for 200 hours, and after exposure in a hot air oven at 230° C. for 100 hours. In each of the above tests, no change was observed on the appearance of the socket.

Specimens specified in ASTM were prepared by injection molding of the pellets under the same conditions as in Example 2 and properties of the specimens were tested. Heat distortion temperature was 242° C., and flexural strength was 2300 kg/cm².

EXAMPLE 6

Polyimide powder was used which was prepared from 2,2-bis[4-(3-aminophenoxy)phenyl]propane as a diamine of the formula (II) and 3,3',4,4'-benzophenonetetracarboxylic dianhydride as a dianhydride of the formula (III) and had an inherent viscosity of 0.45 dl/g. The polyimide powder was pelletized by the same procedures as carried out in Example 1. The pellets obtained were injection molded under the same conditions as in Example 1. A QFP type IC socket having a pin number of 64 and a pitch of 0.5 mm was obtained. The socket thus obtained had excellent characteristics which are comparable to those of Example 1.

Specimens were molded by the same procedures as carried out in Example 1 and physical properties of the specimens were measured. Heat distortion temperature was 240° C. Flexural strength was 1370 kg/cm .

EXAMPLE 7

To a tumbler, 70 parts by weight of the polyimide powder used in Example 5 and 30 parts by weight of a glass fiber having a length of 3 mm and an aspect ratio of 250 were charged and thoroughly mixed. The mixture obtained was then pelletized.

The resulting pellets were injection molded by the same procedures as carried out in Example 2. The resulting QFP type IC socket having a pin number of 64 and a pitch of 0.5 mm was excellent in appearance similar to that of Example 2.

As examined in Example 2, the appearance of the IC socket thus obtained was checked after immersion in toluene and trichloroethylene for 10 days, after exposure to heated steam at 2 kg/cm² for 200 hours, and after exposure in a hot air oven at 230° C. for 100 hours. In any of the above tests, no change was observed on the appearance of the socket.

Specimens specified in ASTM were prepared by injection molding of the pellets under the same conditions as in Example 2 and properties of the specimens were tested. Heat distortion temperature was 241° C., and flexural strength was 2300 kg/cm².

We claim:

1. An integrated circuit socket which is constructed and adapted to fix an integrated circuit on a printed board, said integrated circuit socket comprising a polyimide consisting essentially of recurring units represented by the formula (I):

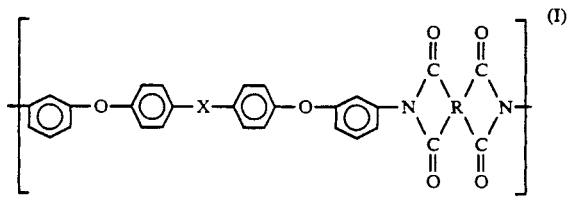

wherein x is a bond or x is a radical selected from the group consisting of a bond or a radical selected from the group consisting of a divalent hydrocarbon having from 1 to 10 carbon atoms, carbonyl, thio, or sulfonyl, and R is a tetravalent radical selected from the group consisting of an aliphatic radical having two or more carbon atoms, cycloaliphatic radical, monoaromatic radical, condensed polyaromatic radical, and non-condensed polyaromatic radical wherein aromatic radicals are mutually connected with a bond or a crosslinking function.

2. The integrated circuit socket of claim 1 wherein said polyimide has an inherent viscosity of from 0.35 to 0.65 dl/g measured as a solution containing 0.5 g of said polyimide in 100 ml of a solvent mixture composed of P-chlorophenol/phenol in a ratio of 90/10 by weight at 35° C.

3. The integrated circuit socket of claim 1 wherein said polyimide has an inherent viscosity of from 0.40 to 0.60 dl/g measured as a solution containing 0.5 g of said polyimide in 100 ml of a solvent mixture composed of P-chlorophenol/phenol in a ratio of 90/10 by weight at 35° C.

4. The integrated circuit socket of claim 1 wherein said polyimide is obtained by reacting an etherdiamine represented by the formula (II):

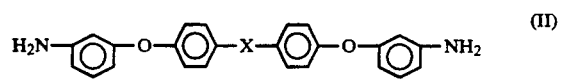

wherein X is the same as above, with one or more of tetracarboxylic acid dianhydride represented by the formula (III):

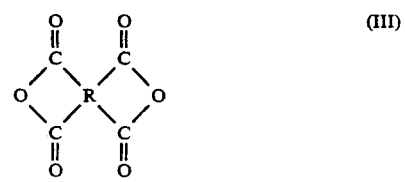

wherein R is the same as above, and said etherdiamine is a compound or a mixture thereof selected from the group consisting of 4,4'-bis[4-(3-aminophenoxy)-phenyl]sulfide, 4,4'-bis[4-(3-aminophenoxy)phenyl]sulfone, 4,4'-bis(3-aminophenoxy)benzophenone, 4,4'-bis(3-aminophenoxy)biphenyl, and 2,2-bis[4-(3-aminophenoxy)phenyl]propane.

5. The integrated circuit socket of claim 4 wherein said tetracarboxylic acid dianhydride is a compound or a mixture thereof selected from the group consisting of pyromellitic dianhydride, 3,3',4,4'-biphenyltetracarboxylic dianhydride, 3,3',4,4'-benzophenonetetracarboxylic dianhydride, 3,3',4,4'-diphenylethertetracarboxylic dianhydride and p-phenyleneoxydi(4-phthalic) dianhydride.

6. The integrated circuit socket of claim 1 comprising said polyimide and glass fiber in an amount of 40% by weight or less by weight.

7. The integrated circuit socket of claim 6 wherein the composition contains a colorant, filler excluding the glass fiber, extender, stabilizer and a lubricant in addition to said glass fiber.

8. The integrated circuit socket of claim 1 wherein powder or pellet of said polyimide is fused, kneaded and pelletized in the presence or absence of at least one of glass fiber and other auxiliary agents, and the resulting pellet is subjected to injection molding.

9. The integrated circuit socket of claim 8 wherein said injection molding is at a cylinder temperature of from 300° to 450° C., mold temperature of from 150° to 230° C., and injection pressure of from 500 to 1500 kg/cm².

* * * * *